US009779802B1

(12) United States Patent
Chang et al.

(10) Patent No.: US 9,779,802 B1
(45) Date of Patent: Oct. 3, 2017

(54) MEMORY APPARATUS AND WRITE FAILURE RESPONSIVE NEGATIVE BITLINE VOLTAGE WRITE ASSIST CIRCUIT THEREOF

(71) Applicant: National Tsing Hua University, Hsinchu (TW)

(72) Inventors: Meng-Fan Chang, Taichung (TW); Yi-Ju Chen, Taichung (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/199,662

(22) Filed: Jun. 30, 2016

(51) Int. Cl.
  *G11C 11/419* (2006.01)
  *G11C 7/10* (2006.01)
  *G11C 7/14* (2006.01)
  *G11C 7/12* (2006.01)

(52) U.S. Cl.
  CPC .......... *G11C 11/419* (2013.01); *G11C 7/1048* (2013.01); *G11C 7/12* (2013.01); *G11C 7/14* (2013.01)

(58) Field of Classification Search
  CPC ....... G11C 11/419; G11C 7/1048; G11C 7/12; G11C 7/14
  See application file for complete search history.

(56) References Cited

U.S. PATENT DOCUMENTS

| | | | |
|---|---|---|---|
| 5,973,972 A * | 10/1999 | Kwon | G11C 7/1048 365/190 |
| 8,120,975 B2 | 2/2012 | Kenkare et al. | |
| 8,305,820 B2 | 11/2012 | Yang et al. | |
| 8,441,874 B2 | 5/2013 | Sinha et al. | |
| 8,837,229 B1 | 9/2014 | Dubey et al. | |
| 9,070,432 B2 | 6/2015 | Hsieh et al. | |
| 9,455,028 B1 * | 9/2016 | Sahu | G11C 7/14 |
| 2007/0081379 A1 | 4/2007 | Clinton et al. | |

(Continued)

FOREIGN PATENT DOCUMENTS

| CN | 102057437 | 5/2011 |
|---|---|---|
| CN | 103871457 | 6/2014 |

(Continued)

*Primary Examiner* — Harry W Byrne
*Assistant Examiner* — Ajay Ojha
(74) *Attorney, Agent, or Firm* — J.C. Patents

(57) ABSTRACT

A write assist circuit includes a write detection circuit, a write detection-aware write driver and a write condition recovery circuit. The write detection circuit receives a detected result signal and a write data, and generates a write detect control signal and generating a selecting signal according to the detection result signal and the write data. The write detection-aware write driver receives the write detect control signal and operates a write detection operation on a selected memory cell according to the write detect control signal, and decides whether to provide a negative voltage to one of a bit line and an inverted bit line of the selected memory cell or not according to the selecting signal. The write condition recovery circuit respectively couples the bit line and the inverted bit line to the write data line and the inverted data line according to a write pass-gate control signal, and provides a pre-charge voltage to the write data line and the inverted data line during the write detection time period according to a recovery signal.

14 Claims, 8 Drawing Sheets

(56) References Cited

U.S. PATENT DOCUMENTS

| | | | |
|---|---|---|---|
| 2010/0188909 A1* | 7/2010 | Kenkare | G11C 11/419 365/189.16 |
| 2014/0160871 A1 | 6/2014 | Zimmer et al. | |
| 2016/0042784 A1* | 2/2016 | Rim | G11C 11/419 365/154 |
| 2016/0118091 A1* | 4/2016 | Asenov | G11C 7/12 365/194 |

FOREIGN PATENT DOCUMENTS

| | | |
|---|---|---|
| TW | 200632925 | 9/2006 |
| TW | I506625 | 11/2015 |

* cited by examiner

MEMORY APPARATUS AND WRITE FAILURE RESPONSIVE NEGATIVE BITLINE VOLTAGE WRITE ASSIST CIRCUIT THEREOF

BACKGROUND OF THE INVENTION

Field of Invention

The present invention generally relates to a memory apparatus, and more particularly to a write assist circuit of the memory apparatus with negative bit line scheme.

Description of Prior Art

Referring to FIG. 1, FIG. 1 illustrates a schematic plot of a static random access memory (SRAM) cell. The SRAM cell 100 includes six transistors, and is coupled to a bit line BL, an inverted bit line BLB, and a word line WL. In a data writing operation, when a stored data at a node N1 is logic "1" and a write data with logic "0" is written to the node N1, the write data is carried on the bit line BL with logic "0", and the transistor PG is turned on according to a signal on the word line WL. At the same time, the transistor PU is also turned on by a voltage on the node N2 with logic "0". That is, the node N1 is discharge to logic "0" by the transistor PG, and is also charge to a power voltage VDD (logic "1") by the transistor PU. It should be noted here, when driving abilities of the transistor PG is weaker than the transistor PU owing to process variation, a write-failure event can happen.

SUMMARY OF THE INVENTION

The present disclosure provides a memory apparatus and a write assist circuit thereof, and the write assist circuit can guarantee successful write operations on the memory apparatus with a negative bit line (NBL) write assist scheme.

The present disclosure provides the write assist circuit including a write detection circuit, a write detection-aware write driver and a write condition recovery circuit. The write detection circuit receives a write failure detection enable signal and a write data, and generates a write detect control signal and generating a selecting signal according to a detection result signal and the write data. The write detection-aware write driver receives the write detect control signal and operates a write detection operation on a selected memory cell according to the write detect control signal, and decides whether to provide a negative voltage to one of a bit line and an inverted bit line of the selected memory cell or not according to the selecting signal.

The present disclosure provides the memory apparatus including a plurality of memory cells, a plurality of Y-pass circuits, a plurality of write detection-aware write drivers, a plurality of read circuits and a negative voltage generator shared by multiple input output (I/O) circuits of the memory apparatus. Each of the write detection-aware write drivers includes the write assist circuit mentioned above. The Y-pass circuits are coupled to the memory cells. The write circuits are respectively coupled to the Y-pass circuits, and the read circuits are coupled to the Y-pass circuits and respectively coupled to the write detection-aware write drivers. The negative voltage generator is coupled to the write assist circuits, generated according to an enable signal and provides the negative voltage to all of the write assist circuits according to each of a plurality of selecting signals of each of the I/O circuits.

According to the above descriptions, in the present disclosure, the negative bit line scheme can be activated for assisting the write operation for the memory apparatus. Furthermore, the negative bit lines scheme of present disclosure can be activated dynamically only when it is needed. The write assist circuit may detect whether the write operation is successful or fault, and the negative bit line scheme may be activated only when the write operation is fault. Such as that, dynamic energy of the memory apparatus can be saved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiment of the invention, examples of which are illustrated in the accompanying drawings.

Figure 1:
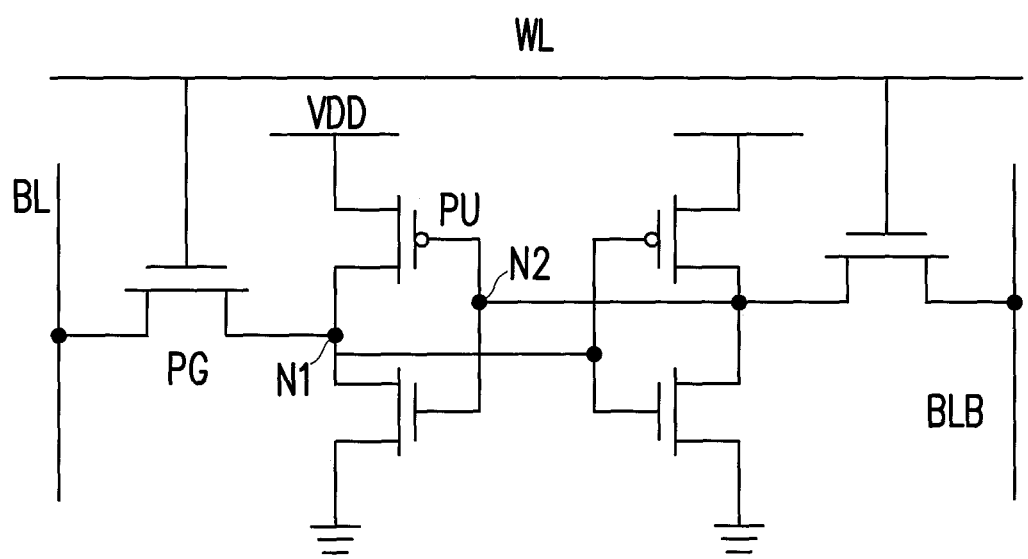
FIG. 1 illustrates a schematic plot of a static random access memory (SRAM) cell.
Figure 2A:
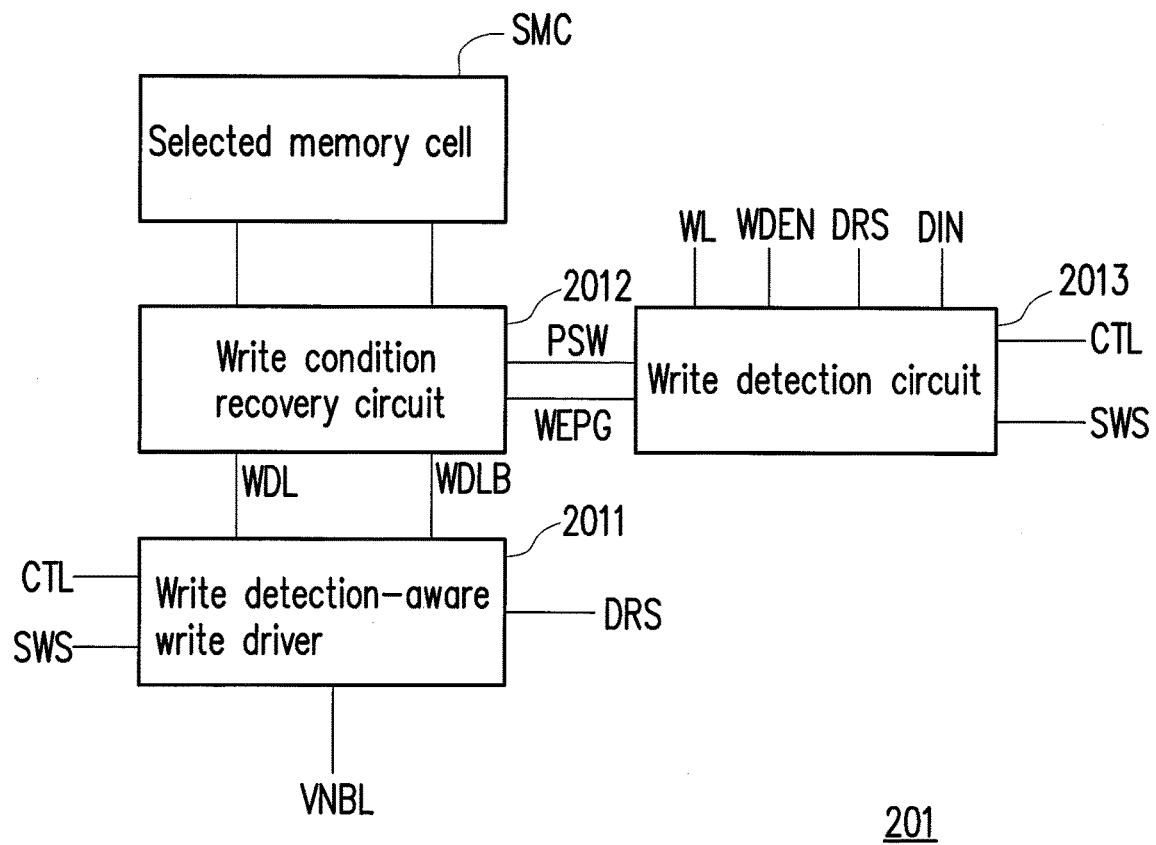
FIG. 2A illustrates a schematic plot of a write assist circuit according to an embodiment of present disclosure.

Referring to FIG. 2A, FIG. 2A illustrates a schematic plot of a write assist circuit according to an embodiment of present disclosure. The write assist circuit 201 includes a write detection-aware write driver 2011, a write condition recovery circuit 2012, and a write detection circuit 2013. During a write detection time period, the write condition recovery circuit 2012 is coupled to a selected memory cell SMC, and the write condition recovery circuit 2012 respectively couples the bit line and the inverted bit line of the selected memory cell SMC to the write data line WDL and the inverted write data line WDLB according to a write pass-gate control signal WEPG, and providing a pre-charge voltage to the write data line WDL or the inverted data line WDLB during the write detection time period according to a recovery signal PSW. The write detection circuit 2013 is coupled to the write condition recovery circuit 2012 and the write detection-aware write driver 2011. The write detection circuit 2013 receives a detected result signal DRS, a write data DIN and a write failure detection enable signal WDEN, and generates a write detect control signal CTL according to the write failure detection enable signal WDEN and the write data DIN during the write detection time period and generates a selecting signal SWS according to the detection result signal DRS and the write data DIN. The write detection circuit 2013 generates the write pass-gate control WEPG according to a word line signal WL and the detected result signal DRS and generates the recovery signal PSW according to the detected result signal DRS. The write detection-aware write driver 2011 is coupled to the write condition recovery circuit 2012. The write detection-aware write driver 2011 receives the write detect control signal CTL and operates a write detection operation on the selected memory cell SMC in real time according to the write detect control signal CTL, and decides whether to provide a negative voltage VNBL to one of a bit line and an inverted bit line of the selected memory cell SMC or not according to the selecting signal SWS. Wherein, a voltage level of the negative voltage VNBL is lower than a voltage level of a reference ground voltage of the write assist circuit 201.

Please be noted here, the write assist circuit 201 activates a negative bit line scheme only when a write-failure event can be determined according to the detected result signal DRS. That is, an efficiency of the negative bit line scheme can be improved.

Figure 2B:
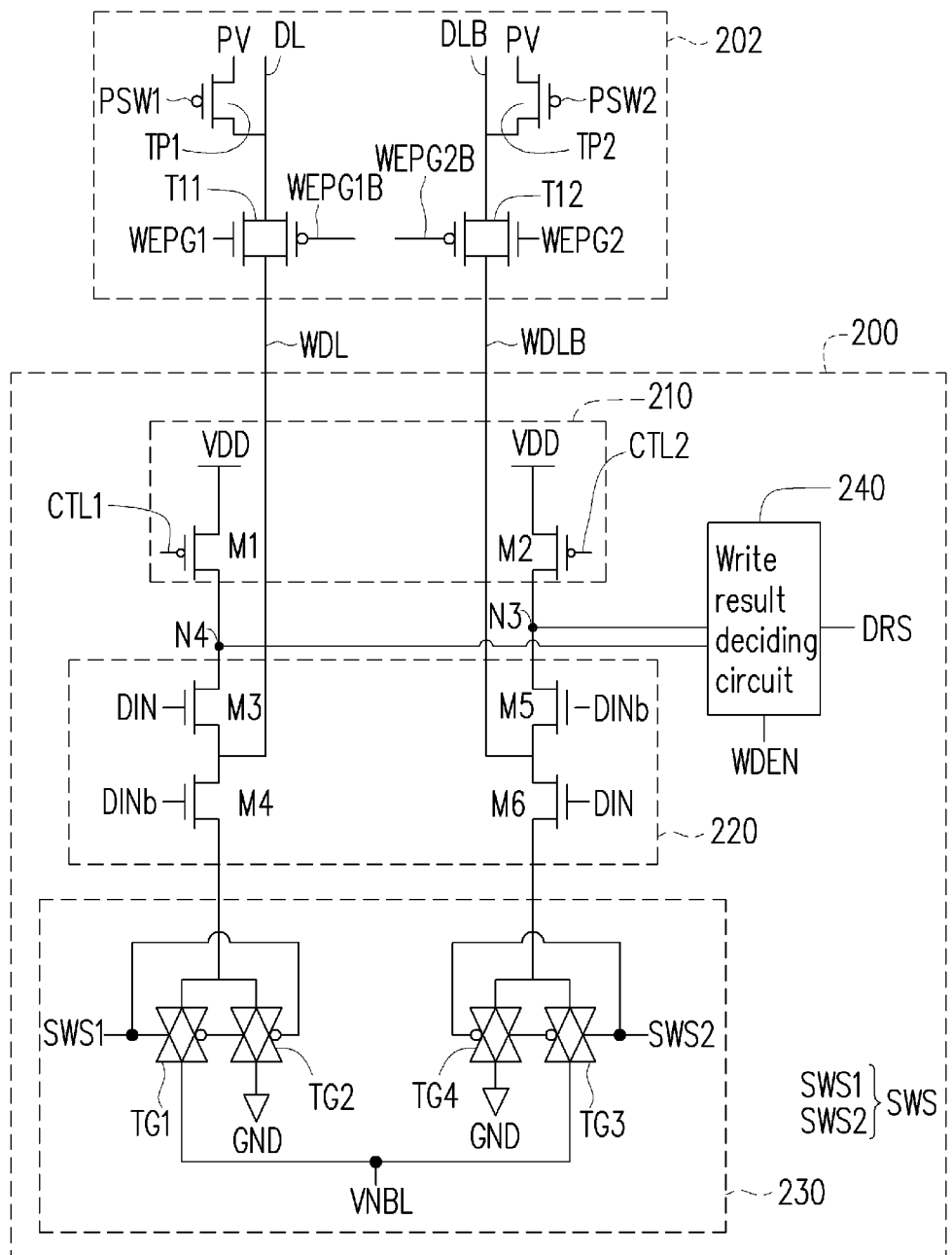
FIG. 2B illustrates a schematic plot of a write detection-aware write driver according to an embodiment of present disclosure.

Referring to FIG. 2B, FIG. 2B illustrates a schematic plot of a write detection-aware write driver according to the embodiment in FIG. 2A of present disclosure. The write detection-aware write driver 200 includes a power stage circuit 210, a driving stage circuit 220, a selecting circuit 230, and a write result deciding circuit 240. The power stage circuit 210 receives a power voltage VDD, and determines whether to float one of a write data line WDL and an inverted write data line WDLB of a selected memory cell or not according to sub-signals CTL1 and CTL2 of a write detect control signal during a write detection time period, wherein the sub-signals CTL1 and CTL2 may be generated according to a write failure detection enable signal WDEN, and a write data DIN The selected memory cell may be a static random access memory (SRAM) cell.

Furthermore, in FIG. 2B, the write condition recovery circuit 202 includes transistors TP1 and TP2, transmission gates T11 and T12. The transmission gate T11 is coupled between the data line DL and the write data line WDL, and the transmission gate T12 is coupled between the inverted data line DLB and the inverted write data line WDLB. The transmission gates T11 and T12 are respectively controlled by a write pass-gate control signal WEPG1 (and an inverted write pass-gate control signal WEPG1B) and a write pass-gate control signal WEPG2 (and an inverted write pass-gate control signal WEPG1B) to be turned on or cut off. The transistors TP1 and TP2 are respectively coupled to the data line DL and the inverted data line DLB. The transistors TP1 and TP2 respectively provides a pre-charge voltage PV to the data line DL and the inverted data line DLB according to the recovery signal PSW1 and PSW2.

In detail, in a data writing operation, the transmission gates T11 and T12 are turned on, and the write data line WDL and the inverted write data line WDLB are respectively connected to a bit line and an inverted bit line of the selected memory, and the write data DIN can be written to the selected memory cell through the write data line WDL and the inverted write data line WDLB. Then, before the write detection time period of the data writing operation, one of the write data line WDL and the inverted write data line WDLB is pulled to logic "0" to be a writing "0" side, and another one of the write data line WDL and the inverted write data line WDLB is pre-charged to logic "1" to be a writing "1" side, and after the write failure detection period starts, the power stage circuit 210 floats one of the write data line WDL and the inverted write data line WDLB according to the sub-signals CTL1 and CTL2.

In this embodiment, the power stage circuit 210 includes transistors M1 and M2. The transistor M1 receives the power voltage VDD and is coupled to the write data line WDL through the driving stage circuit 220, and the transistor M2 receives the power voltage VDD and is coupled to the inverted write data line WDLB through the driving stage circuit 220. The transistors M1 and M2 are respectively controlled by the sub-signals CTL1 and CTL2. For example, if the write data DIN with logic "0" is written to the selected memory cell through the write data line WDL in the data writing operation, the driving stage circuit 220 may float the inverted write data line WDLB by cutting off the transistor M2 according to the sub-signal CTL2 after the data writing operation. If the selected memory cell is not flipped yet, a voltage level on the inverted write data line WDLB may be discharged by the selected memory cell, and a voltage level on a node N3 is reduced. If the voltage level on the node N3 is lower than a threshold value, the write-failure event can be determined. On the contrary, if the selected memory cell have been flipped successfully, the voltage level on the node N3 is not discharged and is not lower than the threshold value, a write success event can be determined.

The driving stage circuit 220 is coupled to the power stage circuit 210, the selecting circuit 230, and the write result deciding circuit 240. The driving stage circuit 220 provides one of a first selected voltage and the power voltage VDD to the write data line WDL, and provides one of a second selected voltage and the power voltage VDD to the inverted write data line WDLB according to the write data DIN.

In this embodiment, the driving stage circuit 220 includes transistors M3-M6. A first end of the transistor M3 is coupled to a second end of the transistor M1, a second end of the transistor M3 is coupled to the write data line WDL, and a control end of the transistor M3 receives the write data DIN. A first end of the transistor M4 is coupled to the write data line WDL, a second end of the transistor M4 receives the first selected voltage from the selecting circuit 230, and a control end of the transistor M4 receives an inverted write data DINb. Moreover, a first end of the transistor M5 is coupled to a second end of the transistor M2, a second end of the transistor M5 is coupled to the inverted write data line WDLB, and a control end of the transistor M5 receives the inverted write data DINb. A first end of the transistor M6 is coupled to the inverted write data line WDLB, a second end of the transistor M6 receives the second selected voltage from the selecting circuit 230, and a control end of the transistor M6 receives the write data DIN. Wherein, the write data DIN is inverted to the inverted write data DINb.

Please note, when the write-failure event mentioned above is determined, the transistor M4 may be turned on by the inverted write data DINb (with logic "1") and the transistor M4 transports the first selected voltage to the write data line WDL. In this case, the first selected voltage is selected to be a negative voltage VNBL, and a voltage level of the negative voltage VNBL is smaller than a voltage of a reference ground voltage GND of the selected memory cell. That is, a negative bit line scheme can be performed, and a write assist operation can be achieved.

The selecting circuit 230 is coupled to the driving stage circuit 220. The selecting circuit 230 selects one of the negative voltage VNBL and the reference ground voltage GND to generate the first selected voltage and selects one of the negative voltage VNBL and the reference ground voltage GND to generate the second selected voltage according to the selecting signal SWS.

The selecting circuit 230 is coupled to the driving stage circuit 220. The selecting circuit 230 selects one of the negative voltage VNBL and the reference ground voltage GND to generate the first selected voltage and selects one of the negative voltage VNBL and the reference ground voltage GND to generate the second selected voltage according to the selecting signal SWS.

Please note, when the write success event is determined, the selecting circuit 230 provides the reference ground voltage GND to generate both of the first and second selected voltages. On the contrary, when the write-failure event is determined, the selecting circuit 230 provides the reference ground voltage GND to generate one of the first and second selected voltages for providing to a selected write data line for writing logic "1", and provides the negative voltage VNBL to generate another one of the first and second selected voltages for providing to an unselected write data line for writing logic "0".

In this embodiment, the selecting circuit 230 includes transmission gates TG1-TG4. The transmission gate TG1 has an input end for receiving the negative voltage VNBL, an output end for generating the first selected voltage, and the transmission gate TG1 may be turned on or cut off according to a sub-signal SWS1 of a selecting signal SWS. The transmission gate TG2 has an input end for receiving the reference ground voltage GND and an output end coupled to the output end of the transmission gate TG1, wherein the transmission gate TG2 is turned on or cut off according to the sub-signal SWS1 of the selecting signal SWS. Moreover, the transmission gate TG3 has an input end for receiving the negative voltage VNBL, an output end for generating the second selected voltage, and the transmission gate TG3 is turned on or cut off according to a sub-signal SWS2 of the selecting signal SWS. The transmission gate TG4 has an input end for receiving the reference ground voltage GND and an output end coupled to the output end of the transmission gate TG3, wherein the transmission gate TG4 is turned on or cut off according to the sub-signal SWS2 of the selecting signal SWS. Wherein, on or off statuses of the transmission gates TG1 and TG2 are complementary, on or off statuses of the transmission gates TG3 and TG4 are complementary. The selecting signal SWS can be generated according to the detection result signal DRS and the write data DIN.

The write result deciding circuit 240 is coupled to the power stage circuit 210 and the driving stage circuit 220. The write result deciding circuit 240 generates the detection result signal DRS according to signals on the nodes N4, N3 and the write failure detection enable signal WDEN. The nodes N4 and N3 are respectively coupled to the write data line WDL and the inverted data line WDLB.

Figure 2C:
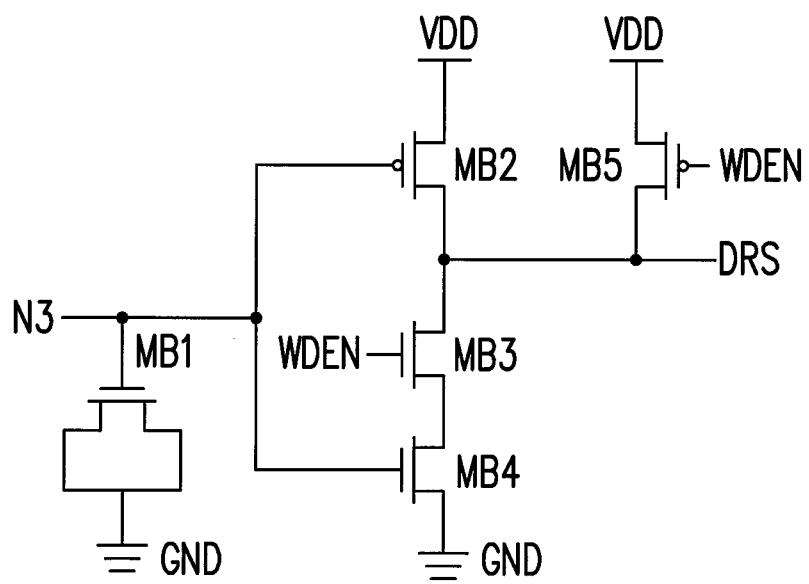
FIG. 2C illustrate a schematic plot of the write result deciding circuit according to the embodiment in FIG. 2B of present disclosure.

Referring to FIG. 2C, FIG. 2C illustrates a schematic plot of the write result deciding circuit according to the embodiment in FIG. 2B of present disclosure. In this embodiment, the write result deciding circuit 240 includes transistors MB1-MB5. The transistor MB1 forms a capacitor, and coupled between the node N3 and a reference ground GND. The transistors MB2-MB4 are coupled between a power voltage VDD and the reference ground GND in series, and control ends of the transistor MB2 and MB4 are coupled to the node N3, and a control end of the transistor MB3 receives the write failure detection enable signal WDEN. A first end of the transistor MB5 receives the power voltage VDD, a second end of the transistor MB5 generates the detection result signal DRS, and a control end of the transistor MB5 receives the write failure detection enable signal WDEN.

In detail operation of the write result deciding circuit 240, during the write failure detection operation is operated, the transistor MB3 is turned on (the transistor MB5 is cut-off), and the transistors MB2 and MB4 form an inverter, and a voltage on the node N3 is inverted to generate the detection result signal DRS. If the voltage level on the node N3 is reduced to lower than the threshold value of the inverter formed by the transistors MB2 and MB4, the detection result signal DRS with logic "1" can be generated, and the write-failure event can be detected. On the other hand, if the voltage level on the node N3 is not reduced to lower than the threshold value of the inverter formed by the transistors MB2 and MB4, the detection result signal DRS with logic "0" can be generated, and the write access event can be detected.

In detail operation of the write result deciding circuit 240, during the write failure detection operation is operated, the transistor MB3 is turned on (the transistor MB5 is cut-off), and the transistors MB2 and MB4 form an inverter, and a voltage on the node N3 is inverted to generate the detection result signal DRS. If the voltage level on the node N3 is reduce to lower than the threshold value of the inverter formed by the transistors MB2 and MB4, the detection result signal DRS with logic "1" can be generated, and the write-failure event can be detected. On the other hand, if the voltage level on the node N3 is not reduce to lower than the threshold value of the inverter formed by the transistors MB2 and MB4, the detection result signal DRS with logic "0" can be generated, and the write access event can be detected.

When not operating the write failure detection operation, the transistor MB3 is cut-off and the transistor MB5 is turned on. At this time, the voltage of the detection result signal DRS is pulled up to the power voltage VDD through the transistor MB5. Furthermore, the capacitor formed by the transistor MB1 is used to adjust a variable speed of the voltage on the node N3.

Figure 3:
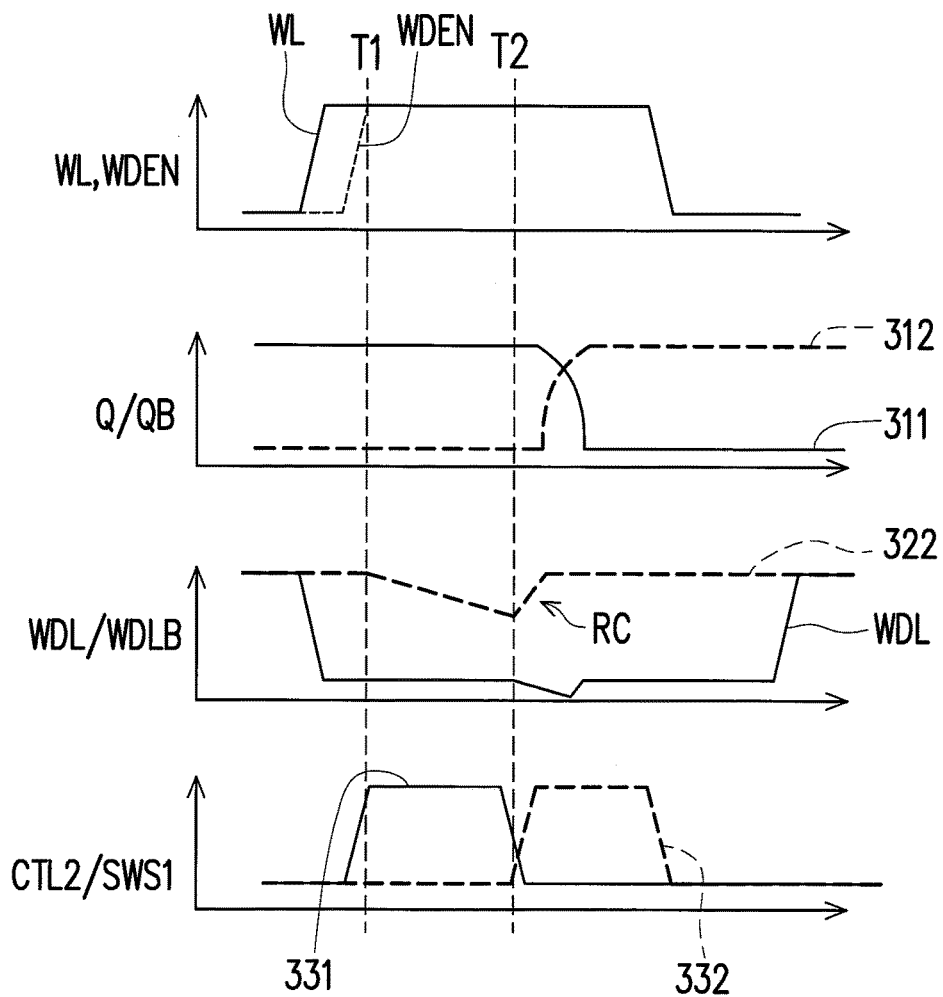
FIG. 3 illustrates waveform plot of the write assist circuit according to the embodiment of present disclosure.

Referring to FIG. 3, FIG. 3 illustrates waveform plot of the write assist circuit according to the embodiment of present disclosure. In FIG. 3, at the time point T1, after a rising edge of a write failure detection enable signal WDEN, the transistor M2 is cut off to float the inverted write data line WDLB according to the sub-signal CTL2 of the write detect control signal. Since the selected memory cell is not flipped, an inverted output signal QB of the selected memory cell is kept on logic "0" (see curve 312) before the time point T2. Such as that, the voltage level on the inverted write data line WDLB (see curve 322) is reduced from the time point T1 to the time point T2. At the time point T2, the voltage level on the inverted write data line WDLB is lower than the threshold value, and a negative bit line scheme is activated by the sub-signal SWS1 of the selecting signal SWS (see curve 332) after the time point T2. After the time point T2, the voltage level on the inverted write data line WDLB is recovered according to the sub-signal CTL2 (referring to the arrow RC). The write data line WDL is further pulled down corresponding to the negative bit line scheme. By the write assist operation provided by the negative bit line scheme, an output data Q (see curve 311) and the inverted output data QB can be flipped successfully, and the data write operation can be completed efficiently.

Figure 4:
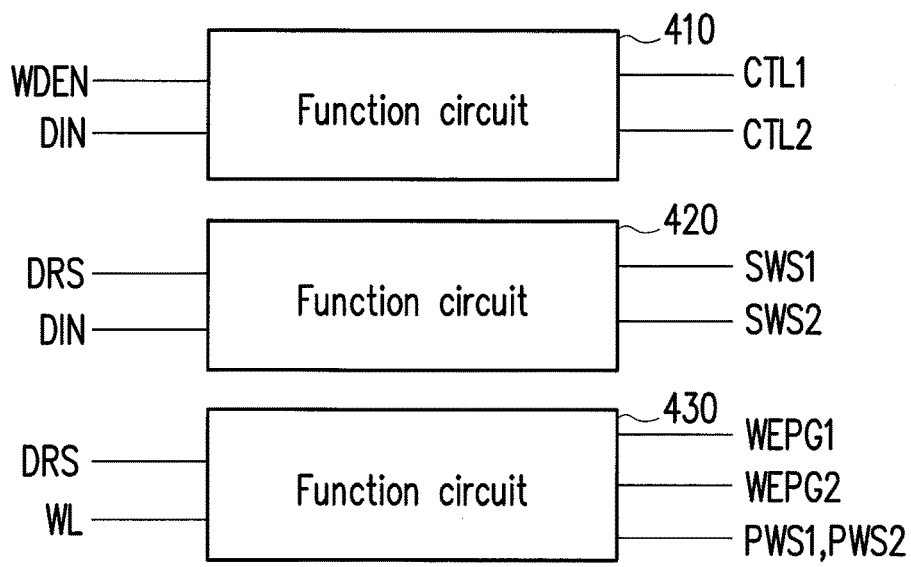
FIG. 4 illustrates a block diagram of function circuits according to an embodiment of present disclosure.

Referring to FIG. 4, FIG. 4 illustrates a block diagram of function circuits according to an embodiment of present disclosure. The write assist circuit of present disclosure may further include function circuits 410, 420 and 430. The function circuit 410 is coupled to the power stage circuit and the write result deciding circuit, and generates the sub-signals CTL1 and CTL 2 of the write detect control signal according to the write failure detection enable signal WDEN, and the write data DIN. The second function circuit 420 is coupled to the write result deciding circuit, generates the sub-signals SWS1 and SWS2 of the selecting signal SWS according to the detection result signal DRS and the write data DIN. The function block 430 receives the detection result signal DRS and the word line signal WL. The function block 430 generates the recovery signals PSW1, PSW2 according to the detected result signal DRS, and generates the write enable signals WPEG1 and WPEG2 according to a word line signal WL and the detected result signal DRS.

The function circuits 410-430 may be implemented by one or more logic gate(s), and any one of design methods for digital circuit design known by a person skilled in the art can be used for implementing the function circuits 410 and 420.

Figure 5:
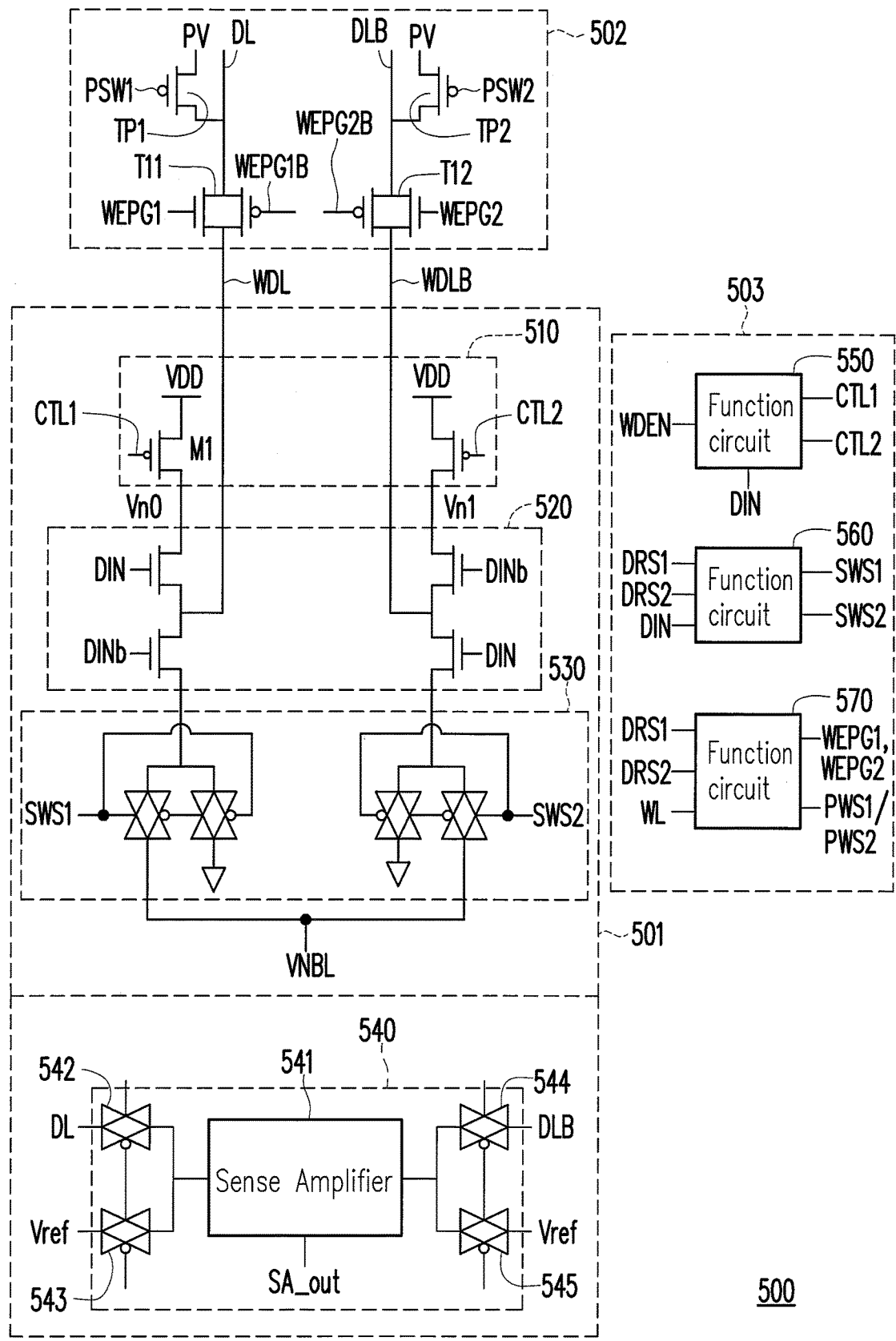
FIG. 5 illustrates a schematic plot of a write assist circuit according to another embodiment of present disclosure.

Referring to FIG. 5, FIG. 5 illustrates a schematic plot of a write assist circuit according to another embodiment of present disclosure. The write assist circuit 500 includes a write condition recovery circuit 502, a write detection-aware write driver 501, and a write detection circuit 503. The write detection-aware write driver 501 includes a power stage circuit 510, a driving stage circuit 520, a selecting circuit 530, a write result deciding circuit 540, and function circuits 550, 560 and 570. Comparing with the write detection-aware write driver 200, the power stage circuit 510, the driving stage circuit 520, the selecting circuit 530, and the function circuits 550-570 are respectively same as the power stage circuit 210, the driving stage circuit 220, the selecting circuit 230, and the function circuits 410-430. It should be noted here, the write result deciding circuit 540 is different from the write result deciding circuit 240. In this embodiment, the write result deciding circuit 540 includes a sense amplifier 541 and transmission gates 542-545. The transmission gates 542-543 form a first switch unit for selecting the write data line WDL or a reference voltage Vref to connect to the sense amplifier 541. Further, the transmission gates 544-545 form a second switch unit for selecting the inverted write data line WDLB or the reference voltage Vref to connect to the sense amplifier 542. That is, the sense amplifier 541 may sense a voltage difference between the signal on the selected write data line (the write data line WDL or the inverted write data line WDLB) and the reference voltage Vref to generate a sense out signal SA_out, and the sense out signal SA_out can be used to be the detection result signal DRS.

Additionally, the sense amplifier 541 may be used for a data reading operation for the selected memory cell. The sense amplifier 541 may select to connect to the write data line WDL and the inverted write data line WDLB for the data reading operation. That is, no more additional sense amplifier need to be implement in present embodiment.

Figure 6A:
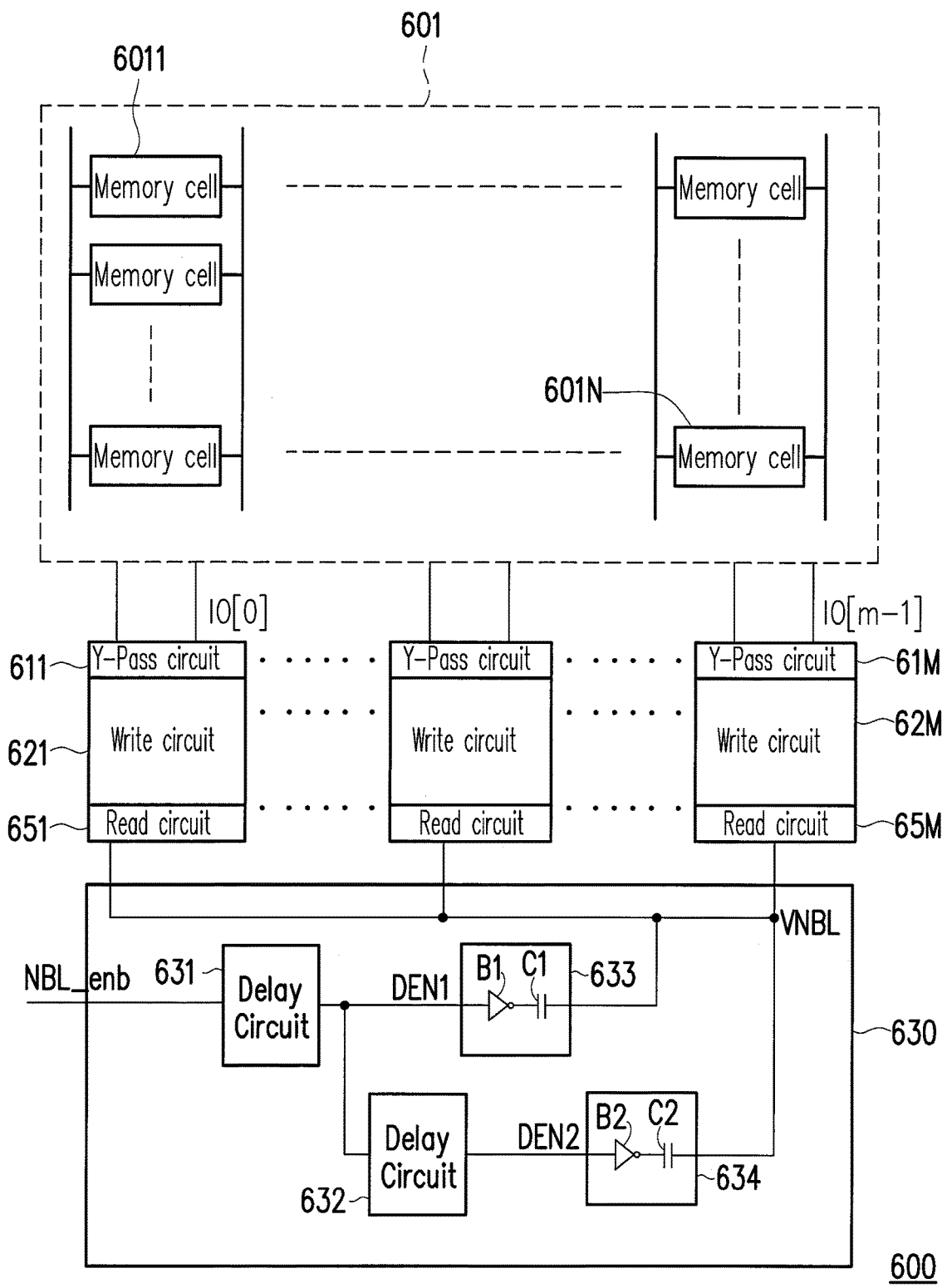
FIG. 6A illustrates a schematic plot of a memory apparatus according to an embodiment of present disclosure.

Referring to FIG. 6A. FIG. 6A illustrates a schematic plot of a memory apparatus according to an embodiment of present disclosure. The memory apparatus 600 includes a plurality of memory cells 6011-601N, a plurality of Y-pass circuits 611-61M, a plurality of write circuits 621-62M, a plurality of read circuits 651-65M, and a negative voltage generator 630. The memory cells 6011-601N form a memory cell array 601, and the memory cells 6011-601N are SRAM memory cells. The Y-pass circuits 611-61M respectively correspond to a plurality of input and output (I/O) circuits IO[0]-IO[M−1], and the Y-pass circuits 611-61M are coupled to the memory cell array 601. The write circuit 621-62M are respectively coupled to the Y-pass circuits 611-61M. The read circuits 651-65M are respectively coupled to the write circuits 621-62M and respectively coupled to the Y-pass circuits 611-61M. The negative voltage generator 630 is coupled to all of the write circuits 621-62M.

Each of the write circuits 621-62M can be implemented by including the write assist circuits 201 or 500 mentioned above. And it should be noted here, only one negative voltage generator 630 is needed for the memory apparatus 600.

Figure 6B:
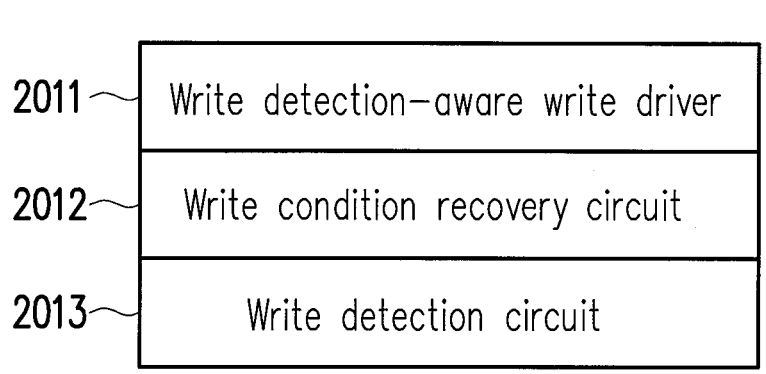
FIG. 6B illustrate a block diagram of the write detection-aware write driver according to the embodiment in FIG. 6A of present disclosure.

Refer to FIG. 6B, FIG. 6B illustrate a block diagram of the write detection-aware write driver according to the embodiment in FIG. 6A of present disclosure. The write detection-aware write driver 621 may include the write detection-aware write driver 2011, the write condition recovery circuit 2012, and the write detection circuit 2013 as shown in FIG. 2A.

The negative voltage generator 630 provides the negative voltage VNBL to one or more of the write circuits 621-62M. The negative voltage generator 630 includes delay circuits 631-632 and voltage pumping circuits 633-634. The delay circuits 631-632 receive an enable signal NBL_enb in sequence, and respectively generate delayed enable signals DEN1 and DEN2 in sequence. The delayed enable signals DEN1 and DEN2 are respectively fed to the voltage pumping circuits 633-634, and the voltage pumping circuits 633-634 generate the negative voltage VNBL by a voltage pumping down operation according to a falling transition of the delayed enable signal DEN1 and DEN2.

In this embodiment, the voltage pumping circuit 633 includes a buffer B1 and a capacitor C1, and the voltage pumping circuit 634 includes a buffer B2 and a capacitor C2. An input end of the buffer B1 receives the delayed enable signal DEN1, and an output of the buffer B1 is coupled to one end of the capacitor C1. Another end of the capacitor C1 generates the negative voltage VNBL. An input end of the buffer B2 receives the delayed enable signal DEN2, and an output of the buffer B2 is coupled to one end of the capacitor C2. Another end of the capacitor C2 generates the negative voltage VNBL.

Numbers of the voltage pumping circuit and the delay circuit are no limit for the negative voltage generator 630. One or more voltage pumping circuit(s) and one or more delay circuit(s) can be implemented in the negative voltage generator 630. In FIG. 6, two voltage pumping circuits and two delay circuits implemented in the negative voltage generator 630 is just an example, and not used to limit a scope of present disclosure.

In summary, the present disclosure provides a write assist circuit for detecting a flipping status for the selected memory cell, and the negative bit line scheme is activated only when the write-failure event happened. That is, the negative bit line scheme can be dynamically activated, and energy consumption can be saved efficiently. Moreover, only one negative voltage generator is needed for the memory apparatus, and size of circuit of the memory apparatus can be reduced, such as that, cost of the memory apparatus can be reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A write assist circuit, comprising:
   a write detection circuit, receiving a detection result signal and a write data, and generating a write detect control signal and generating a selecting signal according to the detection result signal and the write data;
   a write detection-aware write driver, coupled to a write data line and an inverted data write line, receiving the write detect control signal and operating a write detection operation on a selected memory cell in real time according to the write detect control signal, and deciding whether to provide a negative voltage to one of a bit line and an inverted bit line of the selected memory cell or not according to the selecting signal,
   wherein, a voltage level of the negative voltage is smaller than a voltage level of a reference ground voltage of the write assist circuit; and
   a write condition recovery circuit, coupled to the selected memory cell, the write detection-aware write driver, and the write detection circuit, respectively coupling the bit line and the inverted bit line to the write data line and the inverted write data line according to a write pass-gate control signal, and providing a pre-charge voltage to the write data line and the inverted write data line during the write detection time period according to a recovery signal,
   wherein the write detection-aware write driver comprises:
   a power stage circuit, receiving a power voltage, and determining whether to float one of the write data line and the inverted write data line coupled to the selected memory cell or not according to the write detect control signal during the write detection time period, wherein the write detect control signal is generated according to a write failure detection enable signal, and a write data.

2. The write assist circuit according to claim 1, wherein the write detection-aware write driver further comprises:
   a driving stage circuit, coupled to the power stage circuit by a first end, providing one of a first selected voltage and the power voltage to the write data line, and providing one of a second selected voltage and the power voltage to the inverted write data line according to the write data;
   a selecting circuit, coupled to the driving stage circuit, selecting one of a negative voltage and a reference ground voltage to generate the first selected voltage and selecting one of the negative voltage and the reference ground voltage to generate the second selected voltage according to the selecting signal; and
   a write result deciding circuit, coupled to the power stage circuit and the driving stage circuit, generating the detection result signal according to signals on the write data line and the inverted write data line.

3. The write assist circuit according to claim 1, wherein the write detection circuit comprises:
   a first function circuit, coupled to the power stage circuit and the write result deciding circuit, generating the write detect control signal according to the write failure detection enable signal, and the write data; and
   a second function circuit, coupled to the write result deciding circuit, generating a selecting signal according to the detection result signal and the write data,
   wherein, the selecting signal is transported to the selecting circuit, and the selecting circuit selects one of a negative voltage and a reference ground voltage to generate the first selected voltage and selects one of the negative voltage and the reference ground voltage to generate the second selected voltage according to the selecting signal.

4. The write assist circuit according to claim 2, wherein the power stage circuit floats one of the write data line and the inverted write data line during the write detection time period, and the write result deciding circuit generates the detection result signal by deciding whether a voltage level of the floated write data line is lower than a threshold value or not.

5. The write assist circuit according to claim 4, wherein the power stage circuit generates the detection result signal indicating to a write-failure event when the voltage level of the floated write data line is lower than the threshold value.

6. The write assist circuit according to claim 5, wherein the selecting circuit selects the negative voltage to provide to a selected write data line and selects the reference ground voltages to provide to an unselected write data line when the detection result signal indicating to the write-failure event.

7. The write assist circuit according to claim 2, wherein if the driving stage circuit provides the first selected voltage to the write data line, the driving stage circuit provides the reference ground voltage to the inverted write data line, and if the driving stage circuit provides the second selected voltage to the inverted write data line, the driving stage circuit provides the reference ground voltage to the write data line.

8. The write assist circuit according to claim 1, wherein the power stage circuit generates the detection result signal indicating to a write success event when the voltage level of the floated write data line is not lower than the threshold value.

9. The write assist circuit according to claim 1, wherein the power stage circuit comprises:
   a first transistor, having a first end, a second end, and a control end, wherein the first end of the first transistor receives the power voltage, the second end of the first transistor is coupled to the write data line, and the control end of the first transistor receives a first sub-signal of the write detect control signal; and
   a second transistor, having a first end, a second end, and a control end, wherein the first end of the second transistor receives the power voltage, the second end of the second transistor is coupled to the inverted write data line, and the control end of the second transistor receives a second sub-signal of the write detect control signal.

10. The write assist circuit according to claim 9, wherein the driving stage circuit comprises:
    a third transistor, having a first end, second end and a control end, wherein the first end of the third transistor is coupled to the second end of the first transistor, the second end of the third transistor is coupled to the write data line, and the control end of the third transistor receives the write data;
    a fourth transistor, having a first end, second end and a control end, wherein the first end of the fourth transistor is coupled to the write data line, the second end of the fourth transistor receives the first selected voltage, and the control end of the fourth transistor receives an inverted write data;
    a fifth transistor, having a first end, second end and a control end, wherein the first end of the fifth transistor is coupled to the second end of the second transistor, the second end of the fifth transistor is coupled to the inverted write data line, and the control end of the fifth transistor receives the inverted write data; and a sixth transistor, having a first end, second end and a control end, wherein the first end of the sixth transistor is coupled to the inverted write data line, the second end of the sixth transistor receives the second selected voltage, and the control end of the sixth transistor receives the write data.

11. The write assist circuit according to claim 2, wherein the selecting circuit comprises:
 a first transmission gate, having an input end for receiving the negative voltage, an output end for generating the first selected voltage, and the first transmission gate being turned on or cut off according to a selecting signal;
 a second transmission gate, having an input end for receiving the reference ground voltage and an output end coupled to the output end of the first transmission gate, wherein the second transmission gate is turned on or cut off according to the selecting signal;
 a third transmission gate, having an input end for receiving the negative voltage, an output end for generating the second selected voltage, and the third transmission gate being turned on or cut off according to the selecting signal; and
 a fourth transmission gate, having an input end for receiving the reference ground voltage and an output end coupled to the output end of the third transmission gate, wherein the fourth transmission gate is turned on or cut off according to the selecting signal,
 wherein, on or off statuses of the first and second transmission gates are complementary, on or off statuses of the third and fourth transmission gates are complementary.

12. The write assist circuit according to claim 2, wherein the write result deciding circuit comprises:
 a first transistor, forming a capacitor, and coupled between the end the reference ground;
 a second transistor, coupled between the power voltage and an output end, and the second transistor is controlled by a signal on the first end;
 a third transistor, having a first end coupled to the output end, and controlled by the write failure detection enable signal;
 a fourth transistor, coupled between a second end of the third transistor and the reference ground, and controlled by the signal on the first end; and
 a fifth transistor, coupled between the power voltage and the output end, and controlled by the write failure detection enable signal,
 wherein the output end generates the detection result signal.

13. The write assist circuit according to claim 2, wherein the write result deciding circuit comprises a sense amplifier,
 wherein the sense amplifier senses a voltage difference between the signal on the selected write data line and a reference voltage to generate the detection result signal.

14. The write assist circuit according to claim 3, wherein the write detection circuit further comprising a third function circuit, wherein the third function circuit generates the recovery signal according to the detected result signal, and generates the write pass-gate control signal according to a word line signal and the detected result signal.

* * * * *